United States Patent
Parthasarathy et al.

(10) Patent No.: US 8,994,416 B2
(45) Date of Patent: *Mar. 31, 2015

(54) ADAPTIVE MULTI-STAGE SLACK BORROWING FOR HIGH PERFORMANCE ERROR RESILIENT COMPUTING

(71) Applicants: STMicroelectronics International N.V., Amsterdam (NL); STMicroelectronics SA, Montrouge (FR)

(72) Inventors: Chittoor Parthasarathy, Greater Noida (IN); Nitin Chawla, Noida (IN); Kallol Chatterjee, Kolkata (IN); Pascal Urard, Theys (FR)

(73) Assignees: STMicroelectronics International N.V., Amsterdam (NL); STMicroelectronics SA, Montrouge (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/045,642

(22) Filed: Oct. 3, 2013

(65) Prior Publication Data

US 2014/0035644 A1 Feb. 6, 2014

Related U.S. Application Data

(63) Continuation of application No. 13/174,078, filed on Jun. 30, 2011, now Pat. No. 8,552,765.

(30) Foreign Application Priority Data

Jan. 7, 2011 (IN) .................. 37/DEL/2011

(51) Int. Cl.
*H03B 19/00* (2006.01)
*H03K 3/02* (2006.01)
*H03K 3/037* (2006.01)

(52) U.S. Cl.
CPC ................ *H03K 3/02* (2013.01); *H03K 3/0375* (2013.01)
USPC ............ 327/117; 327/198; 327/200; 327/201

(58) Field of Classification Search
USPC ........... 327/115, 116, 117, 118, 34, 161, 185, 327/199–203, 355–361, 208–212, 218; 377/47, 48; 455/4
See application file for complete search history.

(56) References Cited

U.S. PATENT DOCUMENTS

| | | | |
|---|---|---|---|
| 6,990,035 | B2 | 1/2006 | Redwine et al. |
| 7,207,983 | B2 | 4/2007 | Hahn et al. |
| 2001/0017555 | A1* | 8/2001 | Flecheux ...................... 327/117 |
| 2002/0071326 | A1 | 6/2002 | Suzuki |
| 2004/0080999 | A1 | 4/2004 | Madurawe |
| 2005/0162182 | A1 | 7/2005 | Ong |
| 2006/0146596 | A1 | 7/2006 | Madurawe |
| 2006/0176745 | A1 | 8/2006 | Eustis et al. |

(Continued)

*Primary Examiner* — Brandon S Cole
(74) *Attorney, Agent, or Firm* — Allen, Dyer, Doppelt, Milbrath & Gilchrist, P.A.

(57) ABSTRACT

Adaptive scaling digital techniques attempt to place the system close to the timing failure so as to maximize energy efficiency. Rapid recovery from potential failures is usually by slowing the system clock and/or providing razor solutions (instruction replay.) These techniques compromise the throughput. This application presents a technique to provide local in-situ fault resilience based on dynamic slack borrowing. This technique is non-intrusive (needs no architecture modification) and has minimal impact on throughput.

5 Claims, 3 Drawing Sheets

(56) References Cited

U.S. PATENT DOCUMENTS

| | | | |
|---|---|---|---|
| 2007/0182473 A1* | 8/2007 | Pacha et al. | 327/218 |
| 2008/0018367 A1* | 1/2008 | Bazes | 327/117 |
| 2008/0285374 A1 | 11/2008 | Shin | |
| 2009/0207672 A1 | 8/2009 | Nagai | |
| 2009/0303806 A1 | 12/2009 | Edo et al. | |
| 2011/0085401 A1 | 4/2011 | Shin | |
| 2012/0194255 A1 | 8/2012 | Ferreira de Figueiredo | |
| 2012/0257433 A1* | 10/2012 | Yan et al. | 365/51 |

* cited by examiner

ADAPTIVE MULTI-STAGE SLACK BORROWING FOR HIGH PERFORMANCE ERROR RESILIENT COMPUTING

RELATED APPLICATION

This application is a continuation of and claims the benefit of U.S. patent application Ser. No. 13/174,078 filed Jun. 30, 2011 and claims the benefit of India Application No. 37/DEL/2011 filed Jan. 7, 2011, which are incorporated herein in their entirety by reference.

BACKGROUND OF THE INVENTION

The present invention relates to timing errors and in particular but not exclusively to an apparatus and method of handling errors in embedded systems. Adaptive scaling is a technique which places a system as close to a timing failure as possible in order to maximize the energy efficiency of that system. Energy efficiency may be of particular concern for systems with a finite power source such as battery operated systems. In particular but not exclusively, adaptive scaling is useful in embedded systems such as systems on a chip (SoC).

Due to the proximity of an adaptively scaled system to a timing failure, techniques have been proposed for dealing with and detecting timing errors occurring in a system.

Razor is a technique in which a main flip-flop is provided in parallel with a shadow flip-flop. The input data is sampled by the main flip-flop and the shadow flip-flop at different points in time. If an error is detected from the comparison of the output of a shadow latch and the output of the main flip-flop, then the instruction set is replayed. The error may be indicated by the assertion of an error flag. SoC incorporating such techniques need to be designed for instruction replays on the assertion of the error flag.

Modifications have been suggested to Razor in which error detection is provided in a flip flop while correction is performed through architectural replay. In the Razor techniques, instruction replay may be required for every detected error. Each instruction replay consumes power which increases the overall power consumption of a circuit. These techniques may also compromise the throughput of the SoC.

An additional technique for online timing error resilience has been proposed which masks timing errors by borrowing time from successive pipeline stages. This technique is intrusive and requires specific latches and flip-flops. The existing proposed circuitry has limitations regarding the positioning of an error window and detection of certain kinds of errors.

SUMMARY OF THE INVENTION

According to a first aspect of the invention, there is provided an apparatus comprising: first circuitry configured to receive input data and to output data dependent on the input data, responsive to a clock edge; a transition detector configured to detect a transition in the input data within a time window; and control circuitry configured to cause the first circuitry to output data dependent on the input data in response to a detected transition within the time window.

The time window may comprise part of a clock period including a clock edge.

The first circuitry may be a flip-flop.

The control circuitry may be configured to one of set or reset the flip-flop in response to a value of the input data.

The control circuit may be configured to at least one of: input the input data to a set input of the flip-flop in response to the detected transition; and input a compliment of the input data to a reset input of the flip-flop in response to the detected transition.

The control circuitry may comprise: a first multiplexor having: a first input configured to receive the input data; a first output coupled to the set input; and a select input configured to receive an indication of the detected transition.

The first multiplexor may further comprise a second input configured to receive a global set signal.

The control circuitry may further comprise: a second multiplexor having: a first input configured to receive the input data; a first output coupled to the reset input; and a select input configured to receive an indication of the detected transition.

The second multiplexor may further comprise a second input configured to receive a global reset signal.

The transition detector may be configured to provide information in response to a detected transition.

According to a second aspect of the invention, there is provided a system comprising: at least two apparatus with a respective data output coupled to a respective data input; wherein the transition detector of a preceding apparatus is configured to detect a transition within a first time window and the transition detector of a successive apparatus is configured to detect a transition within a second time window.

A time window of each successive apparatus may be wider than a time window of a preceding apparatus.

A succeeding time window may be wider than a preceding time window only if a transition is detected by the preceding apparatus.

The system may further comprise clock gating circuitry configured to receive a clock gating signal from a last apparatus of the at least two apparatus.

The last apparatus may be configured to generate a clock gating signal if a transition detector of the last apparatus detects a transition.

The system may be an integrated circuit.

BRIEF DESCRIPTION OF THE DRAWINGS

Reference is now made by way of example only to the accompanying Figures in which.

DETAILED DESCRIPTION

Figure 1:
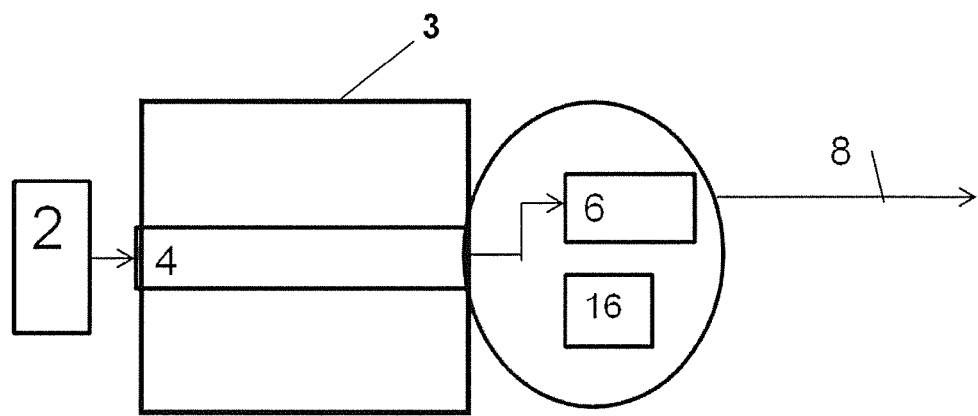
FIG. 1 schematically shows a critical path in a system on chip.

In synchronous circuits the propagation of signals through on-chip logic is controlled by successive flip-flops which clock data into and out of the logic. Data may be clocked into the logic at, for example, a first rising edge of a clock signal and clocked out at the next rising edge of the clock. The clock frequency is selected such that a signal is able to propagate from an input flip-flop to an output flip-flop along a longest path through the logic in one clock cycle. This longest path is called a critical path. The critical path may be considered to have little or no slack. In other words the signal propagating through the critical path will arrive just before a clock edge clocks the output flip-flop. Any delay in the propagation of the signal through the critical path may result in negative slack— in other words the delayed signal will arrive only after the clock edge at the output flip-flop and will fail to be clocked out by the flip-flop. Non-critical paths may be considered to have positive slack. In other words a signal propagated along a non-critical path will arrive at an output flip-flop well before that flip-flop is clocked and therefore there may be some scope for delay in non-critical paths.

Because the critical path has little or no slack, any changes to the clock frequency or delays in the propagation through the critical path due to, for example, temperature or voltage variations may result in erroneous data being clocked out of the output flip-flop. This may be considered a timing failure. The risk of timing failure may increase as a clock frequency is increased.

Embodiments may relate to systems in which adaptive scaling digital techniques are used to attempt to place the system close to the timing failure so as to maximize energy efficiency. Rapid recovery from potential timing failures may be possible by slowing the system clock and/or providing razor solutions (instruction replay). Some embodiments may provide error resilience and time buying which may reduce the number of failures and reduce the frequency of instruction replay and the need for slowing a system clock.

Some embodiments provide local in-situ fault resilience based on dynamic slack borrowing. As will be described in more detail, in-situ transition detectors (TD) with progressively increasing transition windows are provided. Asynchronous correction upon firing of TD flags may be provided. Dynamic slack borrowing across successive serial critical paths is used in some embodiments. In some embodiments there is a bimodal distribution of critical paths in a system on chip. In some embodiments, the final TD stage can trigger clock gating in order to recover, if required. Some embodiments use the low probability of serial critical paths getting excited in successive clock cycles. Some embodiments may provide a non-intrusive design.

Some embodiments may have a principal mode which is error resilient. In some embodiments, there is a relatively high probability that a failure at one end-point can scrape through by using a subsequent critical path's slack. In some embodiments successive critical paths' excitation may have progressively lower probability. The transition windows of successive critical paths may be additively widened to take into account the borrowing in the previous slack. The starting point may be a bimodal end point.

In some embodiments only when the last end point is triggered, is the clock gating activated for the logic in that clock domain to swallow a clock cycle, to thereby enable recovery In some embodiments transitions detectors are used. This may allow for the detection of errors corresponding to a data signal transitioning and then returning to its original value in a detection window. In some embodiments a detection window may be positioned such that transitions occurring before a clock edge may be detected. Some of these embodiments may be used to implement time buying. Some embodiments may be implemented by modifying existing systems such as modifying an existing SoC.

FIG. 1 shows an example of a critical path. The circuitry of FIG. 1 may be implemented, for example, as part of an embedded system or a system on a chip. FIG. 1 shows a first flip-flop 2 and a second flip-flop 6 coupled by logic 3. An output of the first flip-flop 2 is coupled to an input of the logic 3 and an output of the logic 3 is coupled to an input of the second flip-flop 6. The first flip-flop 2 and second flip-flop 6 may be provided with a clock input that controls the clocking of data through the flip-flops. The coupling between the input of the first flip-flop 2 and the second flip-flop 6 through the logic 3 may be via a critical path 4. In other words, a signal propagating from the output of the first flip-flop 2 to the second flip-flop 6 may propagate through the longest path of the logic 3.

It will be appreciated that additional input flip-flops and output flip-flops may be provided for the logic 3. However, only the input flip-flop 2 and output flip-flop 6 corresponding to the critical path 4 through logic 3 is depicted.

The first flip-flop 2 and the second flip-flop 6 may be in the same clock domain and a clock frequency used to clock the flip-flops may be chosen such that the time taken for a signal to propagate along the critical path 4 corresponds to one clock cycle. In some embodiments the circuit of FIG. 1 is implemented on circuitry using adaptive scaling techniques and the clock frequency may be driven near a maximum critical path delay. This may result in a higher probability of a timing error. The first flip-flop 2 may be considered a start point for the critical path 4 and the second flip-flop 6 may be considered an end-point for the critical path 4.

The second flip-flop 6 comprises a transition detector 16. The transition detector 16 may be capable of detecting transition in a data input of the second flip-flop 6. The transition detector may provide the error management in accordance with embodiments.

An output 8 of the second flip-flop 6 may be coupled to a further flip-flop via further logic. A further critical path may be defined between the second flip-flop 6 and further flip-flop. Alternatively a non-critical path may be defined between the second flip-flop 6 and further flip-flop. It will be appreciated that embodiments may comprise a plurality of input and output flip-flops associated with a plurality of logic with a plurality of critical paths. The critical paths may be serial, parallel or independent of each other.

It should be appreciated that one or more of the flip-flops may be replaced by a latch or any other suitable circuitry. Additionally the logic, critical paths and/or non-critical paths may be provided between the flip-flop and an output pin.

Figure 2:
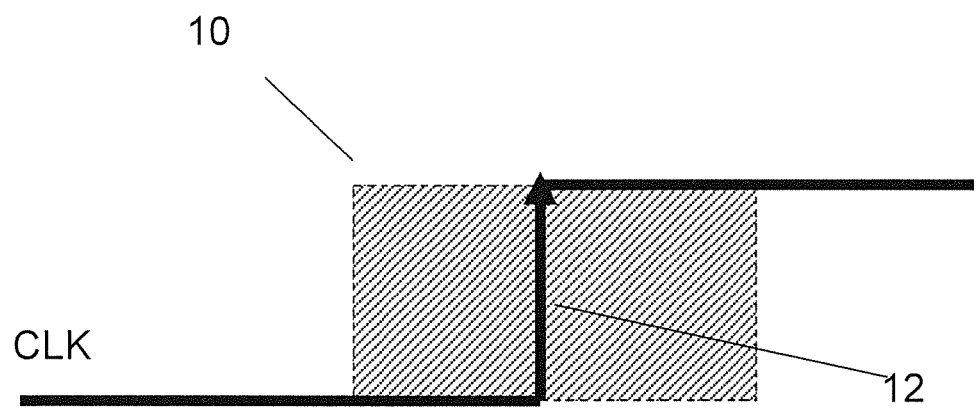
FIG. 2 shows a timing diagram showing when a transition detector flag is asserted.

FIG. 2 shows a clock signal which may be used to clock the second flip-flop 6. The clock signal has a clock edge 12 where the clock signal transitions from low to high which may be used to clock the second flip-flop 6. In FIG. 2 a shaded area is shown which spans the clock edge. This shaded area 10 represents a window. In embodiments any change in the data signal output by the critical path 4 and received by the second flip-flop 6 within this window will be detected by the transition is detector 16.

In embodiments a transition of the data input within this window may indicate a timing failure or close proximity to a timing failure. A signal transition after the clock edge 12 may indicate an error in the data which is latched by the second flip-flop 6 on the transition of the clock signal. It will be appreciated that in embodiments the size of the window may be selected and modified based on the requirements of the system. In some embodiments the size of the window may be programmable. In some embodiments the size of the window may also be dependent on a size of a window of a preceding path. The size of the window may also be based on whether a preceding path is a critical path or non-critical path.

The clock edge may be provided generally in the middle of the window or may be placed closer to one or other of the ends of the window.

The transition detector 16, provided with the second flip flop 6, may be configured to output or assert a transition detector flag when it is determined that the data has changed within the window 10 of the clock edge. In embodiments the transition detector may provide the transition detector flag to circuitry associated with the second flip-flop 6. It will be appreciated that the second flip-flop 6 may provide information to the circuitry associated with the flip-flop regarding a transition. In some embodiments this information is a flag, in other embodiments this information may be a signal or other kind of indication.

Figure 3:
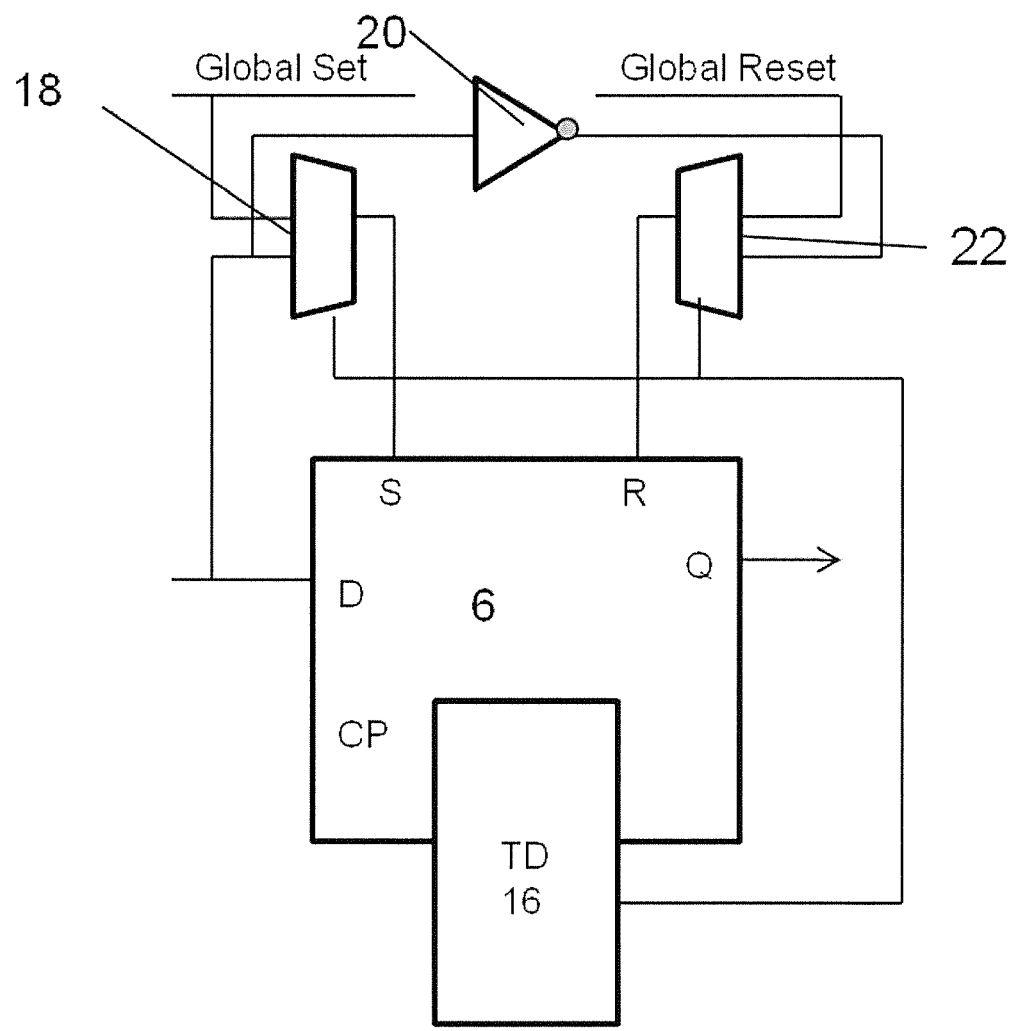
FIG. 3 shows a flip-flop for use in an embodiment.

Reference is made to FIG. 3 which shows the second flip-flop 6 and an embodiment of the associated circuitry in more detail. The second flip-flop 6 has a D input which is configured to receive the data output by the critical path 4 of logic 3. The flip-flop 6 also has a Q output which outputs the received data to a next path or output. The flip-flop 6 has a set S input which is coupled to the output of a first multiplexor 18. The first multiplexor 18 has a first input coupled to a global set signal and a second signal coupled to the data signal output by the critical path, that is the same signal which is input to the data input of the flip-flop.

The flip-flop 6 also has a reset input R which is coupled to the output of a second multiplexor 22. The second multiplexor is arranged to receive a global reset signal as a first signal and the inverted data signal as a second signal. The inverted data signal is output by an inverter 20 which is arranged to be coupled to the data signal at its input.

The first and second multiplexors receive as a control input the output of the transition detector 16. In some embodiments the transition detector is configured to output the transition detector flag when it detects a transition in window 10. When no transition is detected in the window 10, the transition detector does not set a flag and the first inputs of the multiplexors 18 and 22 are provided as the outputs thereof. In other words, the S and R inputs are controlled by respective global set and reset signals. However, when the transition detector 16 detects a transition in window 10 the transition detection flag is asserted and the second inputs of the multiplexors are selected, that is the data input in the case of the first multiplexor and the inverted data input in the case of the second multiplexor.

If the data is 1, the output of the first multiplexor is 1, the output of the second multiplexor is 0, and then the output Q of the flip-flop is 1. Likewise, if the data is 0, the output of the first multiplexor is 0, the output of the second multiplexor is 1, and then the output Q of the flip-flop is 0. In other words, when the transition detection flag is asserted, the data is maintained by the outputs of the first and second multiplexors so that the data which is output by the critical path 4 is also output by the flip-flop 6 even if the data has changed close to the clock edge. The use of the transition detection flag to control the multiplexors 18 and 22 provides a time delay during which time the data will have the correct state and can be output by the flip-flop 6. This may mean that when a transition is detected, the time taken to output the desired data is increased as compared to the case when no transition is detected within the window 10.

It will be appreciated that more than one transition may be detected in the window 10 and thus a signal transitioning to a first state and then back to the original state will also be detected.

It may be appreciated that the circuitry of FIG. 3 may implement asynchronous correction upon firing of the transition detection flag as the output of the flip-flop 6 is corrected according to a detected transition and independently of the clock signal.

Figure 4:
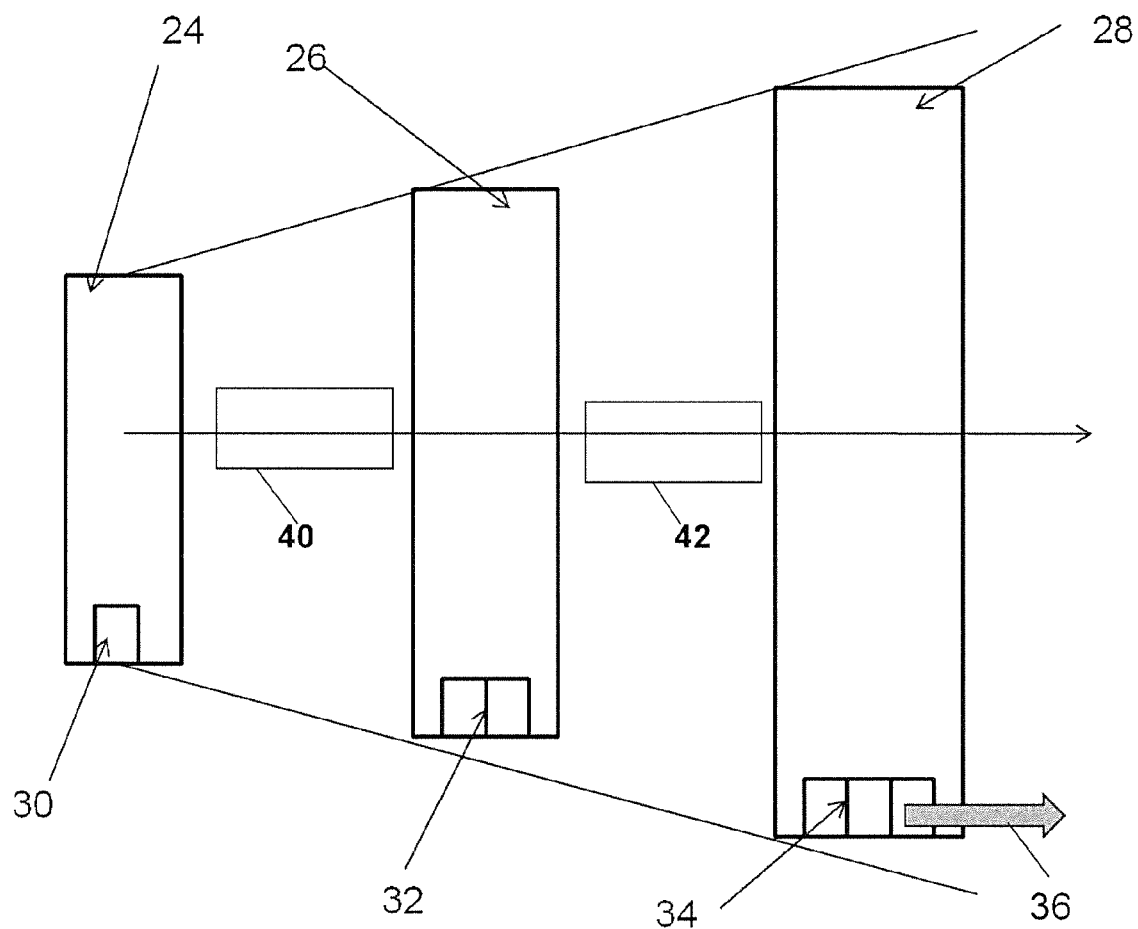
FIG. 4 schematically shows three successive critical paths of an embodiment of the invention.

Reference is made to FIG. 4 which schematically shows a system comprising three flip-flops 24, 26 and 28 forming a serial path through logic in accordance with an embodiment. In some embodiments the system is a SoC. It will be appreciated that the system may comprise more or less flip-flops. The number of serial paths and flip-flops may be a design constraint for the system or may be determined by other means.

In embodiments the system is such that a signal output from the first flip-flop 24 may propagate to an input of the second flip-flop 26 along a first path 40 in logic between the first and second flip-flops 24 and 26. A signal output from the second flip-flop 26 may propagate along a second path 42 between the second and third flip-flop 26 and 28. The flip-flop 28 provides the final stage and the flip-flop 24 may receive at its input, an output from a preceding path.

Each of the flip-flops 24, 26, 28 in FIG. 3 is provided with a transition detector.

Each flip-flop may be an endpoint for a critical path. In this case, the flip-flops may be provided with successively wider windows 30, 32, 34 for their respective transition detectors. For example the second flip-flop 26 may have a window 32 twice as wide as the window 30 of the first flip-flop 24. The third flip-flop 28 may have a window size 34 three times as wide as the first window 30. It will be appreciated that a window size for a path is dependent on a slack of the path. In some embodiments a window size for each path is determined by that path's slack and a window for a successive path may be that path's window plus the window of a preceding path. For example, if the successive critical paths in FIG. 4 have the same slack, the window size of the second serial critical path needs to be the size of the preceding window plus another window for itself. In some embodiments, the unit window size may be programmable.

The above embodiment may operate as described herein. If the transition detector of the first flip-flop 24 detects a transition within the window 30 it raises the transition detector flag which indicates that there is a timing error in the first critical path. It will be appreciated that the window may be sized such that any transition within the window will be indicative of a timing error. The first flip-flop outputs the transition to the second critical path 40 after the first flip-flop 24 has been clocked. The first critical path presents the data late to the second path 40. In this way the first critical path is "borrowing" time from the second critical path 40.

The data has one clock cycle minus the amount of time after the clock edge the data was output to the second critical path 40 to propagate through the second critical path 40 without error. If the data propagates through the second critical path 40 within this time, the second flip-flop will determine that there is no timing error within the larger window and no error will be flagged.

However if the data arrives at the second flip-flop 26 within the second window 32 the second critical path 40 will borrow time from the third critical path 42 and similarly to the first critical path is able to present its data late to the third critical path 42.

If the third critical path 42 determines that there is no timing error, within the third window 24 then no error is flagged and it is determined that there is no need to modify the operating voltage or frequency. However if data arrives within the third window 34 after the clock edge, the third flip-flop 34 may output a signal 36 indicating that error-correction may be required.

The first window 30 may be sized such that it takes into account a potential delay in the propagation of data through the first critical path. The second window 32 may take into account a delay in the provision of data to the second critical path 40 due to the 'borrowing' of the first critical path, as well as a potential delay in the propagating of data through the second critical path 40. The third window 34 may take into account a delay in the provision of data to the third critical path 42 due to the 'borrowing' of the first critical path and the 'borrowing' of the second critical path, as well as a potential delay in the propagating of data through the third critical path 42.

Embodiments may allow a reduction in timing errors propagating through to a final stage in a series of logic such as a logic cone due to a low probability of an excitation of successive serial critical paths. In a worse-case scenario where successive serial critical paths are excited, progressively widening windows allow an error to be propagated through to a final stage where error-handling may take place. The critical paths may have a bimodal distribution. For example critical paths from more than one starting point may end at the same point. The starting point of the transition detection, for example the flip-flop 30, may by the bimodal end-point. In this embodiment, the starting critical path may be more constrained from its successive critical path. In this manner, successive critical path may be in a better position to lend some slack to the starting stage with a lower probability being affected. This may help to simplify the design of number of stages which need to take part in slack borrowing. The error itself may be made to dissolve in fewer stages. In this case, the main dependence for error correction would be the latency with which corrective actions can act. The bimodal distribution may help to 'funnel' the near failure signals to a certain flip-flop or end-point and may reduce the spatial uncertainty of these occurrences.

In some embodiment a critical path may follow onto a non-critical path. For example in FIG. 4, the path 40 may be a critical path and the path 42 may be a non-critical path. In this embodiment data may arrive after a clock edge at the second flip-flop 32 within the window 10 and may be output to the critical path 42 late. Therefore the critical path 40 may borrow time from the non-critical path 42. The non-critical path 42 may have positive slack. In other words the time taken for a signal to propagate through the non-critical path 42 may be less than the clock period. This positive slack may be large enough to make up for the time borrowed by the critical path 40 and data may arrive at the third flip-flop 28 before a clock edge. The third flip-flop 28 will detect no error and no adjustment of the system clock or voltage or instruction replay is required. The window 10 of the critical path endpoint flip-flop 26 may only take into account a potential delay of the critical path 40; alternatively, the window may be sized according to take into account preceding critical paths or other factors.

The 'borrowing' of time from successive critical or non-critical paths may be in accordance with an error resilient mode of operation according to an embodiment. In embodiments when an error has propagated through successive paths, the final endpoint may flag an error and cause error correction to take place. For example, the output signal 36 of the third flip-flop 28 may indicate that clock gating is to take place. The clock gating may comprise swallowing a clock cycle in order to enable recovery. The signal 36 may indicate an action or may provide monitoring information for additional circuitry. The signal may indicate that a frequency or voltage be modified or that an instruction replay is to occur. This may allow error correction such as clock gating to take place only if an error has propagated to the endpoint of the successive paths. In some embodiments, it is likely that the error may not have propagated at all, and hence no action need be taken even though there was an error in a first stage.

In other or further embodiments, when an error has propagated through the first path, an error can be flagged leading to error correction, regardless of whether the failure propagated through the successive paths or not. This can be applied where there is high latency between error flagging and corrective action. When an error has occurred in the first path, the circuit of the present invention is able to 'buy time' to react by allowing correction to be initiated before the error has propagated through the last path. This embodiment may be in accordance with a 'time-buying' mode. For example the output signal 30 of the first flip-flop 26 may indicate that clock gating is to take place. The clock gating may comprise swallowing a clock cycle in order to enable recovery and may indicate an action or may provide monitoring information for additional circuitry. The signal may indicate that a frequency or voltage be modified or than an instruction replay is to occur.

In some embodiments the flip-flop according to FIG. 3 may be provided on critical path end-points, critical path start points or both end and start points. Alternatively the flip-flop according to FIG. 3 may be used to implement all path flip-flops.

It should be appreciated that one or more of the critical paths may be provided with the flip-flop shown in FIG. 2. In alternative embodiments, one or more the critical paths may be provided with a conventional flip-flop arrangement or indeed any other suitable flip-flop or latch arrangement.

Some embodiments may provide an error resilient adaptive system which is capable of working at sub critical operation conditions to provide maximum energy efficiency at a performance point (frequency) or the maximum performance for a given energy consumption (voltage level).

Some embodiments allow fault tolerance for systems by adaptively allowing design margins at timing failure scenarios.

Failure recovery is initiated by adaptive slack borrowing and eventual clock gating when needed. This technique may be non-intrusive (in the sense that no architectural rtl design change is required) and can be applied on legacy or third party IP (Intellectual property) blocks or other such blocks without design changes using conventional synchronous design flows.

Some embodiments may be used with high performance and energy efficient systems designs, for example high performance SoCs with embedded processors working in the range of few GHz. At these performances, some embodiments may allow the elimination of excessive design margins to achieve these peak performance limits.

It will be appreciated that a flip-flop is merely exemplary and that any circuitry capable of outputting data dependent on received input data responsive to a clock edge may be used. The additional circuitry of FIG. 3 is by way of example only and control circuitry capable of causing the flip-flop to output data dependent on the input data in response to a detected transition within the time window may be used in embodiments.

While this detailed description has set forth some embodiments of the present invention, the appended claims cover other embodiments of the present invention which differ from the described embodiments according to various modifications and improvements. Other applications and configurations may be apparent to the person skilled in the art.

The invention claimed is:
1. A circuit comprising:
a flip-flop having a D input for receiving input data, a set input, a reset input, and a Q output;
a transition detector having an output configured to detect a transition in the input data within a time window;
a first multiplexer having a first input for receiving a global set signal, a second input for receiving the input data, a control input coupled to the output of the transition detector, and an output coupled to the set input of the flip-flop; and a second multiplexer having a first input for receiving a global reset signal, a second input for receiving inverted input data, a control input coupled to the output of the transition detector, and an output coupled to the reset input of the flip-flop.

2. A circuit comprising:

a first path coupled to an input of a first flip-flop, wherein the first flip-flop includes a first transition detector having a first time window;

a second path coupled between an output of the first flip-flop and an input of a second flip-flop, wherein the second flip-flop includes a second transition detector having a second time window; and a third path coupled between an output of the second flip-flop and an input of a third flip-flop, wherein the third flip-flop includes a third transition detector having a third time window;

wherein the widths of the first time window, the second time window, and the third time window are different and wherein the circuit is configured to allow the propagation of a signal sequentially through the first path, the first flip-flop, the second path, the second flip-flop, the third path, and the third flip-flop.

3. The circuit of claim 2 wherein the third time window is larger than the second time window, and the second time window is larger than the first time window.

4. The circuit of claim 2 wherein the second time window is twice as wide as the first time window.

5. The circuit of claim 2 wherein the third time window is three times as wide as the first time window.

* * * * *